(12) United States Patent
Prather et al.

(10) Patent No.: US 8,404,960 B2
(45) Date of Patent: Mar. 26, 2013

(54) METHOD FOR HEAT DISSIPATION ON SEMICONDUCTOR DEVICE

(75) Inventors: Zachary A. Prather, Gresham, OR (US); Steven E. Reder, Boring, OR (US); Michael J. Berman, West Linn, OR (US)

(73) Assignee: LSI Corporation, San Jose, CA (US)

( * ) Notice: Subject to any disclaimer, the term of this patent is extended or adjusted under 35 U.S.C. 154(b) by 2026 days.

(21) Appl. No.: 10/930,590

(22) Filed: Aug. 31, 2004

(65) Prior Publication Data

US 2006/0043582 A1 Mar. 2, 2006

(51) Int. Cl.
*H01L 35/30* (2006.01)
*H01L 23/34* (2006.01)

(52) U.S. Cl. ........................................ 136/205; 257/720
(58) Field of Classification Search .................... 257/720
See application file for complete search history.

(56) References Cited

U.S. PATENT DOCUMENTS

| | | | | |
|---|---|---|---|---|
| 5,032,897 A | * | 7/1991 | Mansuria et al. | 257/701 |
| 5,200,809 A | * | 4/1993 | Kwon | 257/707 |
| 6,278,049 B1 | * | 8/2001 | Johnson et al. | 136/201 |
| 6,388,185 B1 | * | 5/2002 | Fleurial et al. | 136/205 |
| 2003/0033818 A1 | * | 2/2003 | Kucherov et al. | 62/3.1 |
| 2003/0034564 A1 | * | 2/2003 | Palanisamy et al. | 257/778 |

* cited by examiner

*Primary Examiner* — Jennifer Michener
*Assistant Examiner* — Dustin Q Dam
(74) *Attorney, Agent, or Firm* — Clark Hill PLC

(57) ABSTRACT

A device and method wherein a thermo electric generator device is disposed between stacks of a multiple level device, or is provided on or under a die of a package and is conductively connected to the package. The thermo electric generator device is configured to generate a voltage by converting heat into electric power. The voltage which is generated by the thermo electric generator can be recycled back into the die itself, or to a higher-level unit in the system, even to a cooling fan.

4 Claims, 2 Drawing Sheets

METHOD FOR HEAT DISSIPATION ON SEMICONDUCTOR DEVICE

BACKGROUND

The present invention generally relates to heat dissipation with regard to semiconductor devices, and more specifically relates to a device and method of converting heat generated by a semiconductor device into electric power.

With the development of larger density, higher speed, multilevel metallization, the problem of heat dissipation on semiconductor devices has become a significant problem. On multilevel dual damascene copper processes (or conventional multilevel Aluminum/Silicon) the number of metal-insulator stacks has increased to the point where convective heat dissipation is no longer effective and the devices will not function properly if the heat build up is too great. For example, an Intel® Pentium 4 processor can have a requirement to dissipate from 75 to 100 Watts at an operating temperature of 75-100 degree Celsius. In addition, the generation of the waste heat causes the unit to use more power, and power that goes into heat does not improve device performance.

Presently, the common solution to this problem is to add fixed element heat exchangers and cooling fans to the back of semiconductor device packages. In certain cases, failures have been documented due to overheating of the devices on an improperly cooled circuit board.

Existing solutions cause application packaging to be bulky and oversized with increased system complexity to incorporate the current methods to reduce the temperatures of the semiconductor packages.

OBJECTS AND SUMMARY

An object of an embodiment of the present invention is to provide a device and method of converting heat generated by a semiconductor device into electric power.

Another object of an embodiment of the present invention is to provide a solution to the problem of overheating of a semiconductor device wherein the solution does not provide that the semiconductor device is bulky, oversized and overly complex.

Briefly, and in accordance with at least one of the foregoing objects, an embodiment of the present invention provides a device and method wherein a thermo electric generator device is disposed between stacks of a multiple level device. The electric generator device can be provided on or under a die of a package and conductively connected to the package. The thermo electric generator device is configured to generate a voltage by converting heat into electric power. The voltage which is generated by the thermo electric generator can be recycled back into the die itself, or to a higher-level unit in the system, even to a cooling fan.

BRIEF DESCRIPTION OF THE DRAWINGS

The organization and manner of the structure and operation of the invention, together with further objects and advantages thereof, may best be understood by reference to the following description, taken in connection with the accompanying drawings, wherein.

DESCRIPTION

Figure 1:
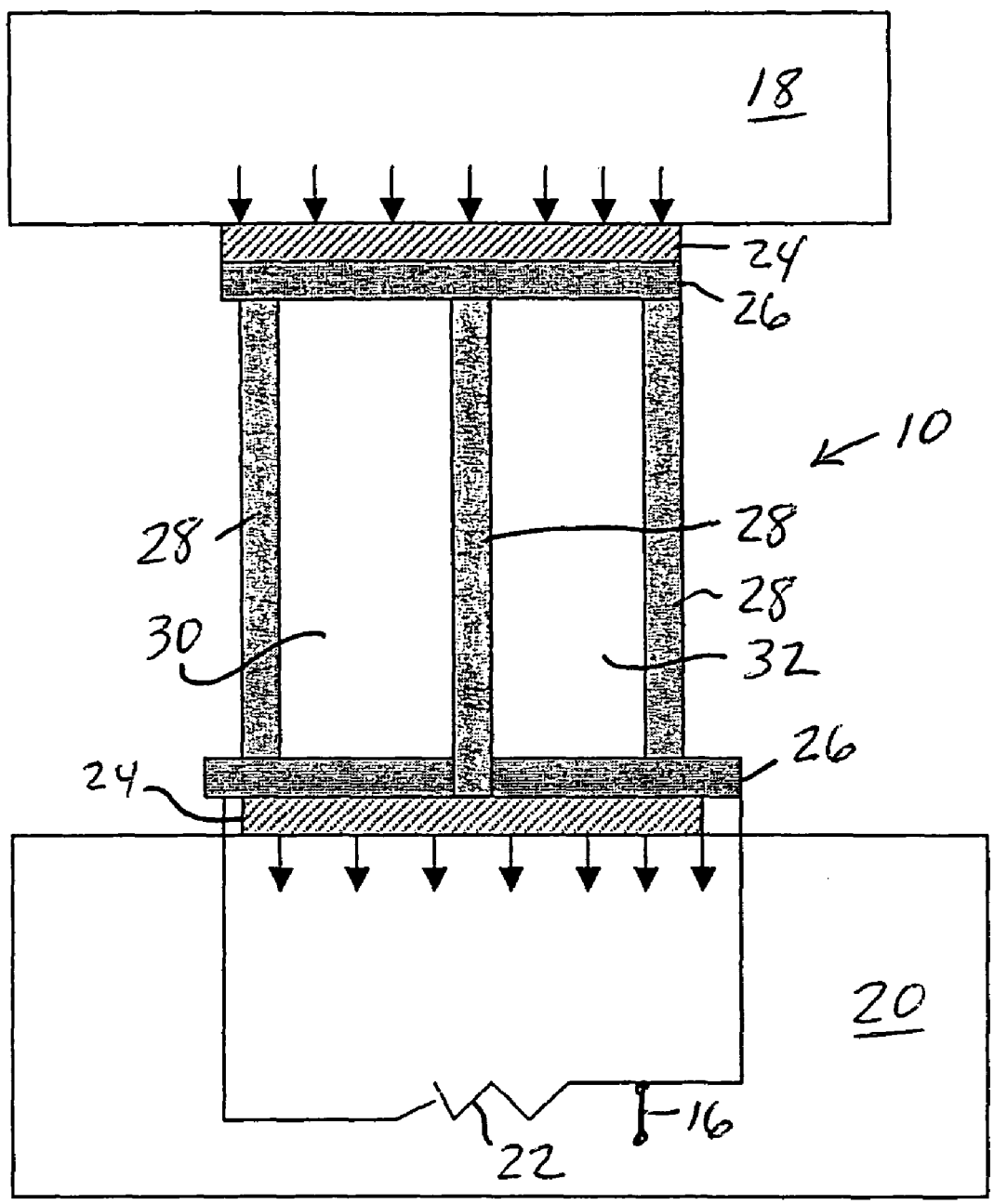
FIG. 1 illustrates an embodiment of the present invention wherein a thermo electric generator device is provided between two layers of a multiple level device.

While the invention may be susceptible to embodiment in different forms, there are shown in the drawings, and herein will be described in detail, specific embodiments of the invention. The present disclosure is to be considered an example of the principles of the invention, and is not intended to limit the invention to that which is illustrated and described herein.

Figure 2:
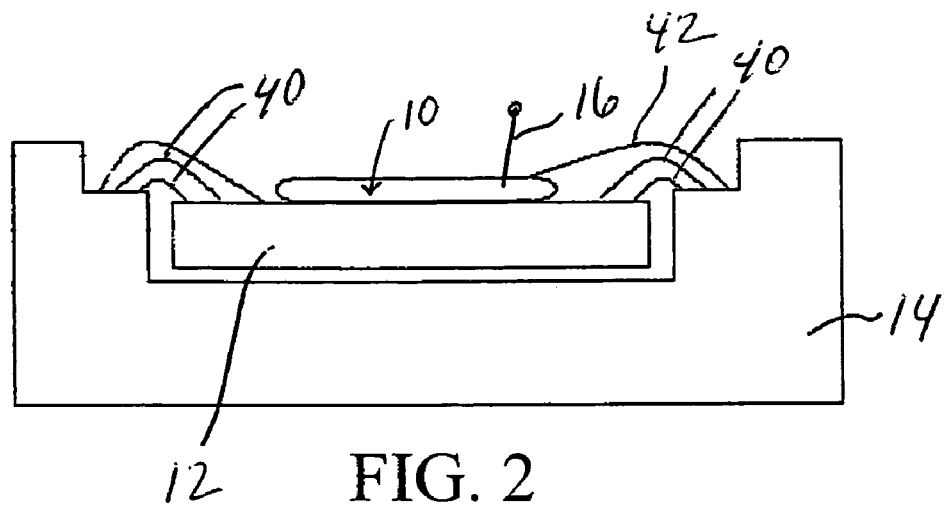
FIG. 2 illustrates an embodiment of the present invention wherein a thermo electric generator device such as shown in FIG. 1 is provided on a die, connected to a package.
Figure 3:
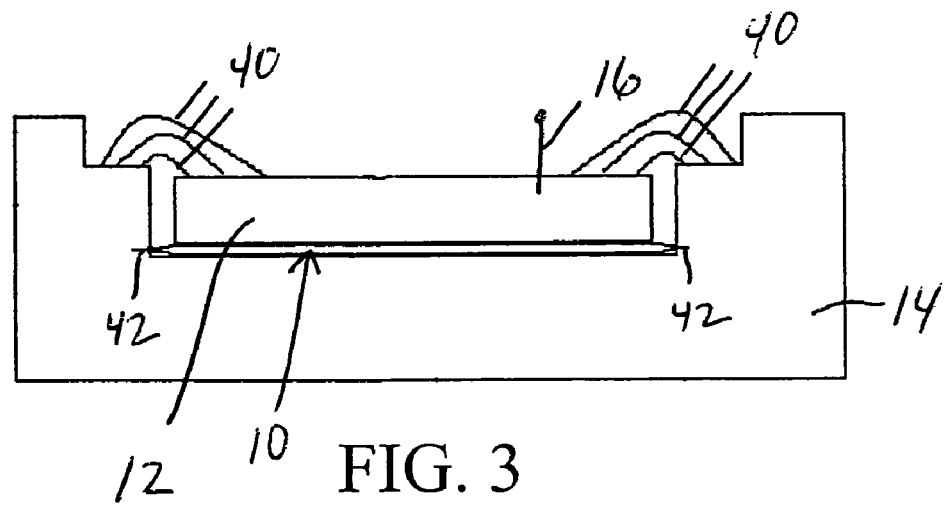
FIG. 3 illustrates an embodiment of the present invention wherein a thermo electric generator device such as shown in FIG. 1 is provided under a die, connected to a package.

The present invention provides the incorporation of a thermo electric generator device 10 built right on a semiconductor device or its package. This device 10 can be, for example, sandwiched in between the middle stacks of a multi-level device (as shown in FIG. 1), provided on a die 12 (as shown in FIG. 2) or provided between the die 12 and the package 14 (as shown in FIG. 3). Regardless, the thermo electric generating device 10 is configured to generate a voltage by converting the waste heat into electric power. As represented by line 16 in each of FIGS. 1, 2 and 3, this voltage can be recycled by the system, back into the die itself, or to a higher-level unit in the system, even to a cooling fan.

As shown in FIG. 1, thermo electric generation is based on the Seebeck principle where electrical energy is generated from temperature differences between a hot reservoir (which may be one layer 18 of a multi-level device) and a cold reservoir (which may be another layer 20 of a multi-level device), by connecting two materials to the hot reservoir and having them both terminate separately at the cold reservoir. If, within the cold reservoir, the materials are connected to opposite ends of an electrical load, power will be generated as represented by voltage 22 in FIG. 1 (power is consumed at the hot reservoir and generated at the cold reservoir).

In FIG. 1, reference numeral 24 identifies electrical insulator, thermal conductor layers, reference numeral 26 identifies electrical conductor, thermal insulator layers, and reference numeral 28 identifies electrical and thermal insulation. Additionally, reference numeral 30 identifies a p-type material, and reference numeral 32 identifies an n-type material. Preferably, materials 30 and 32 are chosen to be p and n type semiconductor materials, respectively, which have the high figures of merit, Z, wherein Z is defined as the ratio of the Seebeck coefficient to the product of the thermal and electrical resistivity: $Z=\alpha/(\rho*\kappa)$, where $\alpha$=Seebeck coefficient=$\Delta V/\Delta T$, $\rho$ is the electrical resistivity, and $\kappa$ is the thermal conductivity.

Preferably, the exact materials are chosen to maximize this value, while minimizing cost. Because optimization of thermo-electric devices involves minimizing the length of the p and n materials, they are well suited for incorporation into a semiconductor chip.

The amount of electrical power generated is dependent on the amount of heat transferred from the hot reservoir ($q_h$) (i.e., layer 18 in FIG. 1), which is at a temperature $T_h$, and the efficiency of the thermoelectric generator, $\eta$.

The electrical power generated is equal to $q_h*\eta$.

$$q_h = K\Delta T + \alpha^2 I\, T_h - 0.5*RI$$

where K is the overall heat conductivity of the materials;
R is the overall electrical resistance of the materials;
$\Delta T$ is the temperature difference between the hot and cold reservoirs, $T_h - T_c$, (i.e., the temperature difference between layers 18 and 20 in FIG. 1);
I is the electrical current produced; and
$\eta$ is closely related to the Carnot efficiency, $\Delta T/T_h$.

A single thermo-electric generator of dimensions 1 cm² × 0.1 cm thick, operating at $T_h$ 100° C. and $T_c$=25° C., can easily produce an electrical power output of 0.43 W with a thermal efficiency of 3.4%, using well-documented materials. In this case, $q_h$, the heat input into the generator would be 12.36 W. Increasing $T_h$ would increase $q_h$ and the thermal efficiency. Stacking additional units on top of each other would additively increase the power output. Improved materials would also improve the efficiency.

The thermo-electric cooling circuit 10 can be provided as a prefabricated layered structure, such as a laminate. This layered structure could be produced off-line and incorporated onto the die in the final stages of fab or with the die in the package. It could be applied to the top surface of the wafer as a part of the final passavation process. Then, the normal pad mask can be cut into the layered structure after before pad mask. This could give improved heat removal, from the top of the die, but not interfere with the normal interconnect of the device. It would also permit masking and interconnection to the thermo-electric cooling circuit at the same time as the die.

The thermo electric generator can provide greater power density on the die by more efficiently removing heat from the die, and possible by "recycling" the waste heat into power to be reused by the system.

The present invention may allow for a greater number of metal layers to be added to devices for additional functionality. Additionally, smaller final products can be realized by the elimination of external cooling methods now in use.

The several embodiments discussed, such as providing the thermo electric generator between the layers or on top of the device, can be utilized. More than one level of this heat removing material can also be used to give even greater removal of heat. For example, the layered structure can be both below and on top of the die. This application can also be applied to high power semiconductors or other III-V technologies. This could also be a part of the cavity that the die is placed on top (see FIG. 3).

FIG. 2 illustrates an embodiment wherein the thermo electric generator device 10 is provided as a top layer, i.e., a layered structure on top of a die 12, wire bonded to the package 14 to remove the electric power generated by the thermo electric generator device 10. Lines 40 represent the normal wire bond from the die 12 to the package 14, while line 42 represents wire bond from the thermo electric generator device 10 to the package 14. FIG. 3 is very similar to FIG. 2, but shows the situation where the thermo electric generator device 10 is under the die 12, rather than on top.

The present invention provides a device and method of converting heat generated by a semiconductor device into electric power. As such, the present invention provides a solution to the problem of overheating of a semiconductor device wherein the semiconductor device need not be provided as being bulky, oversized and overly complex.

While embodiments of the present invention are shown and described, it is envisioned that those skilled in the art may devise various modifications of the present invention without departing from the spirit and scope of the appended claims.

What is claimed is:

1. A thermoelectric generator device comprising: a top layer; a bottom layer; a first electrical conductor, thermal insulator layer in contact with said top layer; a second electrical conductor, thermal insulator layer in contact with said bottom layer wherein both the first and second electrical conductor, thermal insulator layers are disposed between said top and bottom layers; a p-type material between the first and second electrical conductor, thermal insulator layers; an n-type material between the first and second electrical conductor, thermal insulator layers; and an electrical and thermal insulating layer between the p-type material and the n-type material, wherein a first end of said electrical and thermal insulating layer between the p-type material and the n-type material contacts the first electrical conductor, thermal insulator layer and does not contact the top layer, and wherein a second end of said electrical and thermal insulating layer between the p-type material and the n-type material contacts the second electrical conductor, thermal insulator layer as well as the bottom layer, thereby providing an electrical separation within the second electrical conductor, thermal insulator layer, wherein each of said top and bottom layers comprise an electrical insulator, thermal conductor layer which is non-electrically conductively contactable with a device, and said thermoelectric generator device is configured to covert heat generated by the device into electric power.

2. A thermoelectric generator device as recited in claim 1, wherein the bottom layer of the thermoelectric generator device is in contact with a die.

3. A thermoelectric generator device as recited in claim 1, wherein the top layer of the thermoelectric generator device is in contact with a die, and the bottom layer of the thermoelectric generator device is in contact with a package.

4. A thermoelectric generator device as recited in claim 1, wherein the thermoelectric generator device is sandwiched between two layers of a multiple layer device.

* * * * *